US012609673B2

(12) United States Patent
Li et al.

(10) Patent No.: US 12,609,673 B2
(45) Date of Patent: Apr. 21, 2026

(54) CARTESIAN CURVE CONFIGURATION-BASED BULK ACOUSTIC WAVE RESONATOR AND BULK ACOUSTIC WAVE FILTER

(71) Applicant: HEYUAN AIFO LIGHT COMMUNICATION TECHNOLOGY CO., LTD, Heyuan (CN)

(72) Inventors: Guoqiang Li, Heyuan (CN); Xinyan Yi, Heyuan (CN); Kaibin Xu, Heyuan (CN); Zhipeng Chen, Heyuan (CN)

(73) Assignee: HEYUAN AIFO LIGHT COMMUNICATION TECHNOLOGY CO., LTD, Heyuan (CN)

( * ) Notice: Subject to any disclaimer, the term of this patent is extended or adjusted under 35 U.S.C. 154(b) by 166 days.

(21) Appl. No.: 18/430,728

(22) Filed: Feb. 2, 2024

(65) Prior Publication Data

US 2025/0175147 A1      May 29, 2025

(30) Foreign Application Priority Data

Nov. 24, 2023      (CN) ......................... 202311583290.2

(51) Int. Cl.
    *H03H 9/17*     (2006.01)
    *H03H 9/02*     (2006.01)
    *H03H 9/54*     (2006.01)

(52) U.S. Cl.
    CPC ........ *H03H 9/173* (2013.01); *H03H 9/02015* (2013.01); *H03H 9/02125* (2013.01); *H03H 9/54* (2013.01)

(58) Field of Classification Search
    CPC .............. H03H 9/132; H03H 9/02118; H03H 9/02125; H03H 9/02015; H03H 9/173; H03H 9/02157; H03H 9/54
    See application file for complete search history.

(56) References Cited

U.S. PATENT DOCUMENTS 11,476,825 B2 * 10/2022 Houlden ............ H03H 9/02047
2019/0372548 A1 * 12/2019 Liao ...................... H03H 9/173
(Continued)

FOREIGN PATENT DOCUMENTS

CN     108134588 A     6/2018
CN     113810010 A     12/2021

*Primary Examiner* — Quan Tra

(57) ABSTRACT

Disclosed are a Cartesian curve configuration-based bulk acoustic wave resonator and a bulk acoustic wave filter, belonging to the technical field of resonators. The Cartesian curve configuration-based bulk acoustic wave resonator includes a substrate, a support layer, a bottom electrode, a piezoelectric layer, and a top electrode stacked sequentially, with a cavity disposed between the substrate and the support layer. Contour shapes of overlapping portions of the bottom electrode and the piezoelectric layer and of overlapping portions of the piezoelectric layer and the top electrode are both symmetrical closed figures and the closed figure is comprised of at least one Cartesian curve. The Cartesian curve configuration-based bulk acoustic wave resonator according to the present disclosure allows the resonator to generate fewer vibration nodes, thereby reducing energy loss and greatly improving the performance of the resonator.

6 Claims, 10 Drawing Sheets

(56)                    References Cited

U.S. PATENT DOCUMENTS

2022/0416149 A1*  12/2022  Hou ..................... H10N 30/708
2023/0091745 A1*   3/2023  Chen ........................ H03H 9/54
                                              333/187
2023/0102044 A1*   3/2023  Soon ........................ H03H 3/02
                                              310/311

* cited by examiner

720

710

CARTESIAN CURVE CONFIGURATION-BASED BULK ACOUSTIC WAVE RESONATOR AND BULK ACOUSTIC WAVE FILTER

CROSS REFERENCE TO RELATED APPLICATIONS

The present application claims the benefit of Chinese Patent Application No. 2023115832902 filed on Nov. 24, 2023, the contents of which are incorporated herein by reference in their entirety.

TECHNICAL FIELD

The present disclosure belongs to the technical field of resonators, and in particular to a Cartesian curve configuration-based bulk acoustic wave resonator and a bulk acoustic wave filter.

BACKGROUND

During the operation of bulk acoustic wave resonators, longitudinal acoustic wave transmission is mainly utilized to complete the conversion of electrical energy-mechanical energy-electrical energy. However, during the operation of existing resonators, there is also a transverse mode in addition to a longitudinal transmission mode, which will seriously affect the performance of the resonator.

In the prior art, to suppress the generation of the transverse mode, a resonator is generally designed in a shape without parallel edges and right angles (the shape of the resonator refers to a contour shape of overlapping portions of a bottom electrode and a piezoelectric layer and of overlapping portions of the piezoelectric layer and a top electrode), such as a pentagon (referring to FIG. 2), which is intended to reduce the parasitic effect by increasing a transmission distance of transverse waves.

However, the above shapes still cause more vibration nodes in the resonator, which results in some energy loss and thus degraded resonator performance (e.g., Q value).

Therefore, the prior art has yet to be improved and developed.

SUMMARY

The present disclosure aims to provide a Cartesian curve configuration-based bulk acoustic wave resonator and a bulk acoustic wave filter, which allows the resonator to generate fewer vibration nodes, thereby reducing energy loss and greatly improving the performance of the resonator.

In a first aspect, the present disclosure provides a Cartesian curve configuration-based bulk acoustic wave resonator, including a substrate, a support layer, a bottom electrode, a piezoelectric layer, and a top electrode stacked sequentially, with a cavity disposed between the substrate and the support layer, where contour shapes of overlapping portions of the bottom electrode and the piezoelectric layer and of overlapping portions of the piezoelectric layer and the top electrode are both symmetrical closed figures and the closed figure is comprised of at least one Cartesian curve.

According to the Cartesian curve configuration-based bulk acoustic wave resonator provided by the present disclosure, it has a shape of a symmetric closed figure formed by a Cartesian curve, which is capable of further suppressing a transverse mode compared to a conventional pentagonal resonator, so as to improve the performance of the resonator.

Further, the contour shapes of the overlapping portions of the bottom electrode and the piezoelectric layer and of the overlapping portions of the piezoelectric layer and the top electrode overlap completely.

The contour shapes and contour sizes are all the same and thus be easier to process, with relatively low processing costs.

Further, the contour shapes of the overlapping portions of the bottom electrode and the piezoelectric layer and of the overlapping portions of the piezoelectric layer and the top electrode are the same and the contour sizes of the overlapping portions of the bottom electrode and the piezoelectric layer and of the overlapping portions of the piezoelectric layer and the top electrode decrease or increase in order.

Further, the contour shapes of the overlapping portions of the bottom electrode and the piezoelectric layer and of the overlapping portions of the piezoelectric layer and the top electrode are each in a shape of a Cartesian cardioid.

Within the cardioid structure, transverse waves have a longer propagation path, which causes a greater loss to the transverse waves, thus reducing adverse effects of the transverse waves on the performance of the resonator.

Further, the contour shapes of the overlapping portions of the bottom electrode and the piezoelectric layer and of the overlapping portions of the piezoelectric layer and the top electrode are each in a shape of a Cartesian folium.

The folium is smooth and can increase a transmission distance of the transverse waves, which causes a greater loss to the transverse waves, achieving the weakening and suppression of the transverse waves.

Further, the contour shapes of the overlapping portions of the bottom electrode and the piezoelectric layer and of the overlapping portions of the piezoelectric layer and the top electrode are each in a shape of a Cartesian oval.

Further, the closed figure further comprises at least one straight line.

Further, the substrate is made of any one of Si, $SiO_2$, SiC, sapphire, $LiGaO_2$, and metal elements;

the support layer is made of any one of AlN, $SiO_2$, SiC, and $Si_3N_4$; the bottom electrode and the top electrode are made of any one of Al, Mo, W, Pt, Ti, Au, and Ru, respectively; and the piezoelectric layer is made of any one of single crystal AlN, polycrystal AlN, ZnO, PZT, $LiNbO_3$, $LiTaO_3$, and BST.

In a second aspect, the present disclosure provides a bulk acoustic wave filter, including the above Cartesian curve configuration-based bulk acoustic wave resonator.

Further, included are a plurality of the Cartesian curve configuration-based bulk acoustic wave resonators connected in series with each other and/or a plurality of the Cartesian curve configuration-based bulk acoustic wave resonators connected in parallel with each other.

As can be seen from the above, according to the Cartesian curve configuration-based bulk acoustic wave resonator of the present disclosure, due to the more symmetrical shape of the resonator constituted by the Cartesian curve, compared to the existing pentagonal resonator, it is more able to increase a reflection distance of the transverse waves, thus increasing the energy loss during the transmission of the transverse waves, and thus weakening the transverse waves to achieve the effect of suppressing the transverse mode. At the same time, the Cartesian curve can be obtained directly through a functional relationship, which is more conducive to practical processing. In addition, a curvature of the curve is smooth, which is more conducive to alleviating the problem of stress concentration at edges and corners, so as to optimize and enhance the performance of the resonator.

Other features and advantages of the present disclosure will be set forth in the subsequent specification and, in part, will become apparent from the specification or be understood by implementation of embodiments of the present disclosure. The objects and other advantages of the present disclosure may be achieved and obtained through structures particularly indicated in the specification as written, and in the accompanying drawings.

DESCRIPTION OF NUMERALS

Figure 1:
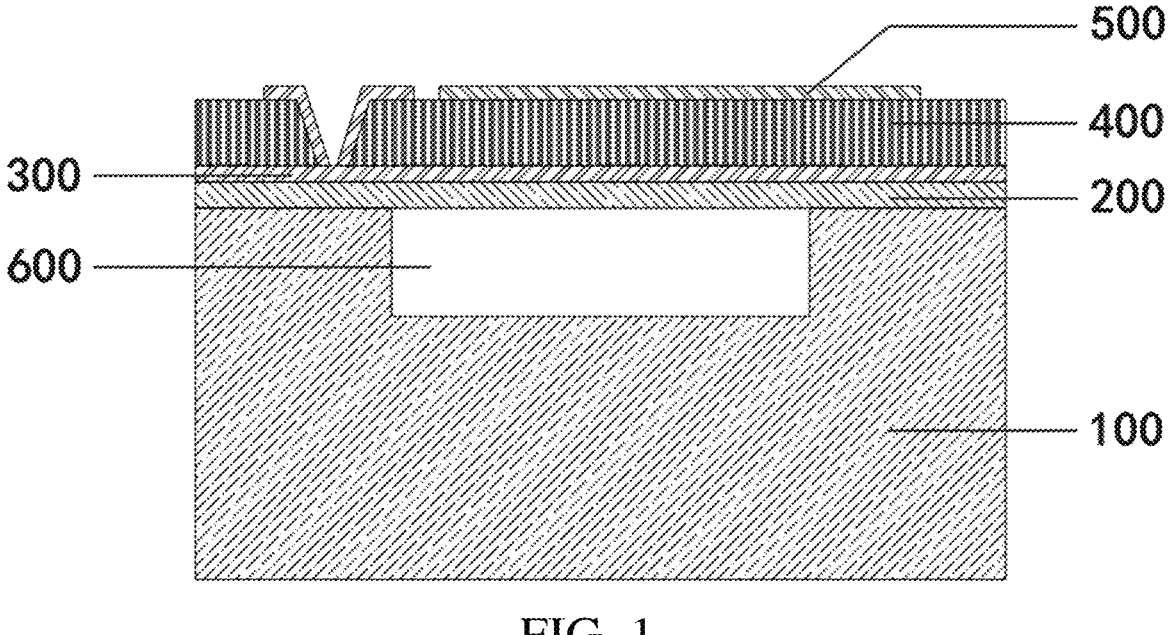
FIG. 1 shows a schematic structural diagram of a Cartesian curve configuration-based bulk acoustic wave resonator provided by an embodiment of the present disclosure.

100, substrate; 200, support layer; 300, bottom electrode; 310, back-end signal; 400, piezoelectric layer; 500, top electrode; 510, front-end signal; 600, cavity; 710, Cartesian curve; and 720, straight line.

DETAILED DESCRIPTION

Embodiments of the present disclosure are described in detail below, and examples of the embodiments are illustrated in the accompanying drawings, where the same or similar numerals throughout the specification indicates the same or similar elements or elements having the same or similar functions. The embodiments described below by reference to the accompanying drawings are exemplary and are only intended to explain the present disclosure and are not to be construed as a limitation to the present disclosure.

In the description of the present disclosure, it is to be understood that the terms indicating orientation or positional relationships based on those shown in the accompanying drawings such as "center", "longitudinal", "transverse", "length", "width", "thickness", "upper", "lower", "front", "back", "left", "right", "vertical", "horizontal", "top", "bottom", "inside", "outside," "clockwise," "counterclockwise," and the like, are only intended for facilitating the description of the present disclosure and simplifying the description, but are not intended to indicate or imply that a device or element referred to must have a particular orientation, be constructed and operated in a particular orientation, and therefore are not to be construed as a limitation to the present disclosure. In addition, terms "first" and "second" are only intended for description, but cannot be construed as indicating or implying relative importance or implicitly indicating the number of the specified technical features. As a result, a feature defined with "first" and "second" may expressly or implicitly include one or more of the features. In the description of the present disclosure, "a plurality of" means two or more, unless otherwise explicitly defined.

In the description of the present disclosure, it should be noted that unless otherwise explicitly specified and defined, the understanding of terms "installed", "linked" and "connected" should be generalized, for example, the terms may be fixed connected, detachably connected or integrally connected; the terms may be mechanically connected, electrically connected or communicating with each other; and the terms may be directly linked, indirectly linked through an intermediate, communication between the interiors of two elements or an interactive relation between two elements. Those of ordinary skill in the art could understand the specific meanings of the above terms in the present disclosure according to specific situations.

In the present disclosure, unless otherwise explicitly specified or defined, the first feature being "on" or "beneath" the second feature may include the first feature being in direct contact with the second feature or the first feature being in contact with the second feature through another feature rather than in direct contact with the second feature. Moreover, the first feature being "on", "over" and "above" the second feature may include the first feature being over and above the second feature, or only represents that the level of the first feature is higher than the level of the second feature. The first feature being "beneath", "under" and "below" the second feature may include the first feature being under and below the second feature, or only represents that the level of the first feature is lower than the level of the second feature.

The present disclosure hereinafter provides a lot of different embodiments or examples to implement the different structures of the present disclosure. In order to simplify the disclosure of the present invention, the parts and configurations of the specific examples are described hereinafter. Certainly, they are only illustrative rather than intended to limit the present disclosure. In addition, the present disclosure may repeat reference numbers or reference letters in the different examples, and such repetition is intended for simplification and clarification rather than indicates the relation between the various embodiments and/or configurations discussed. In addition, although the present disclosure provides the examples of various specific processes and materials, those of ordinary skill in the art can realize the application of other processes and/or the use of other materials.

Figure 8:
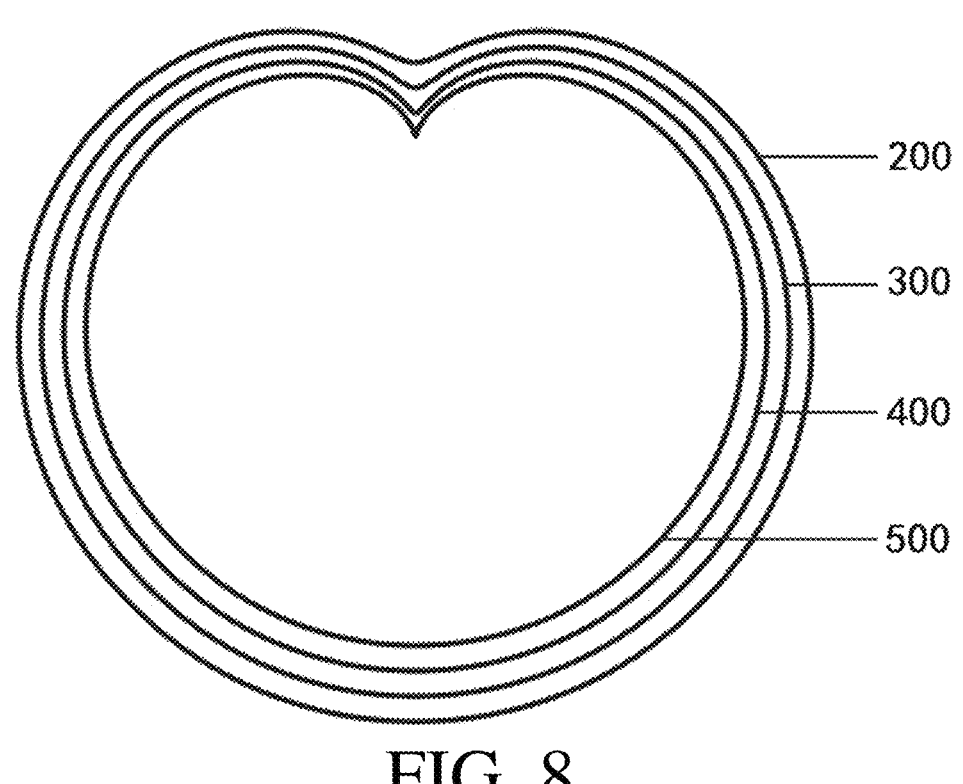
FIG. 8 shows a top view of a resonator in which contour sizes of a support layer, a bottom electrode, a piezoelectric layer, and a top electrode are sequentially reduced inwards in an embodiment of the present disclosure.
Figure 9:
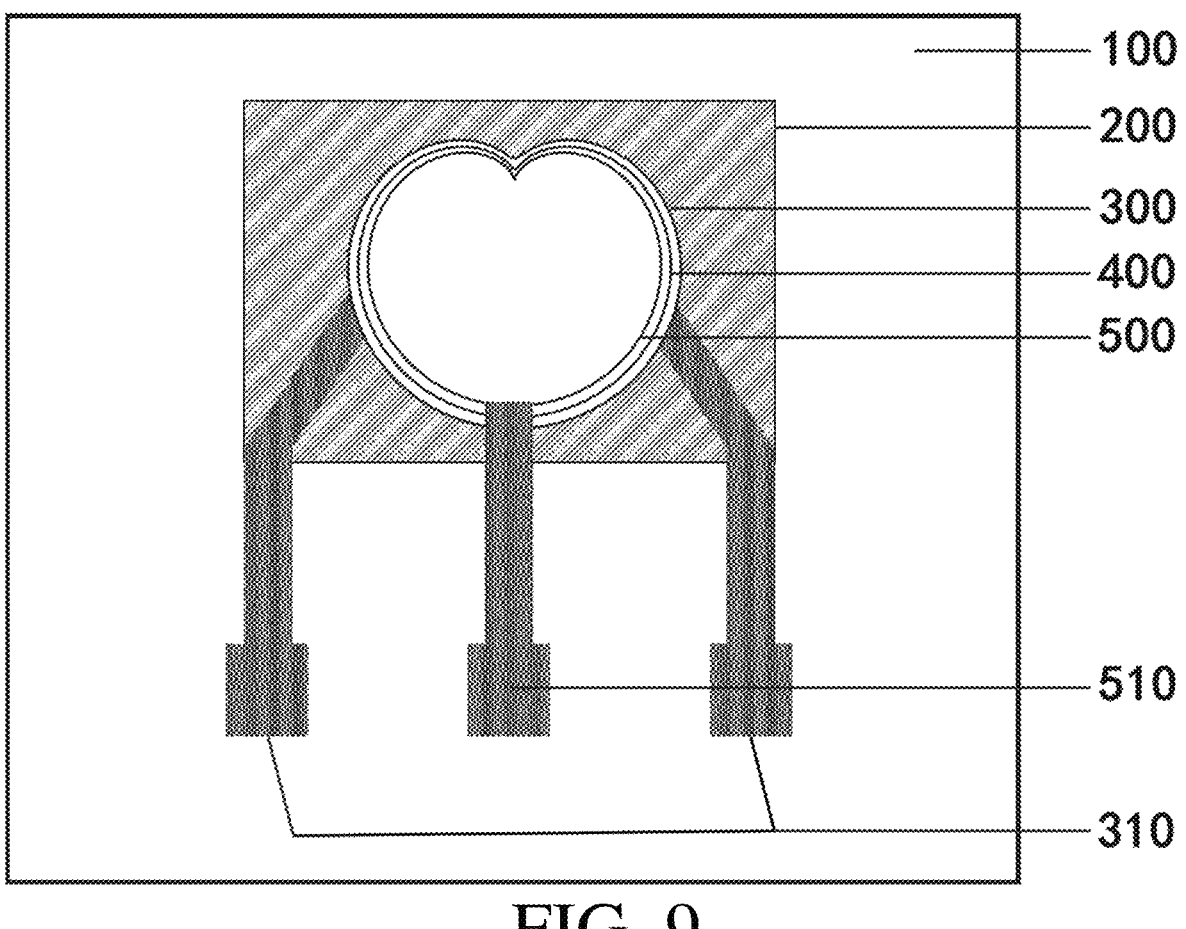
FIG. 9 shows a resonator in a shape of a Cartesian cardioid in an embodiment of the present disclosure.

Referring to FIG. 1, FIG. 8, and FIG. 9, the present disclosure provides a Cartesian curve configuration-based bulk acoustic wave resonator (referred to as a resonator hereafter), including a substrate 100, a support layer 200, a bottom electrode 300, a piezoelectric layer 400, and a top electrode 500 stacked sequentially, with a cavity 600 disposed between the substrate 100 and the support layer 200. Contour shapes of overlapping portions of the bottom electrode 300 and the piezoelectric layer 400 and of overlapping portions of the piezoelectric layer 400 and the top electrode 500 are both symmetrical closed figures and the closed figure is comprised of at least one Cartesian curve 710.

Figure 2:
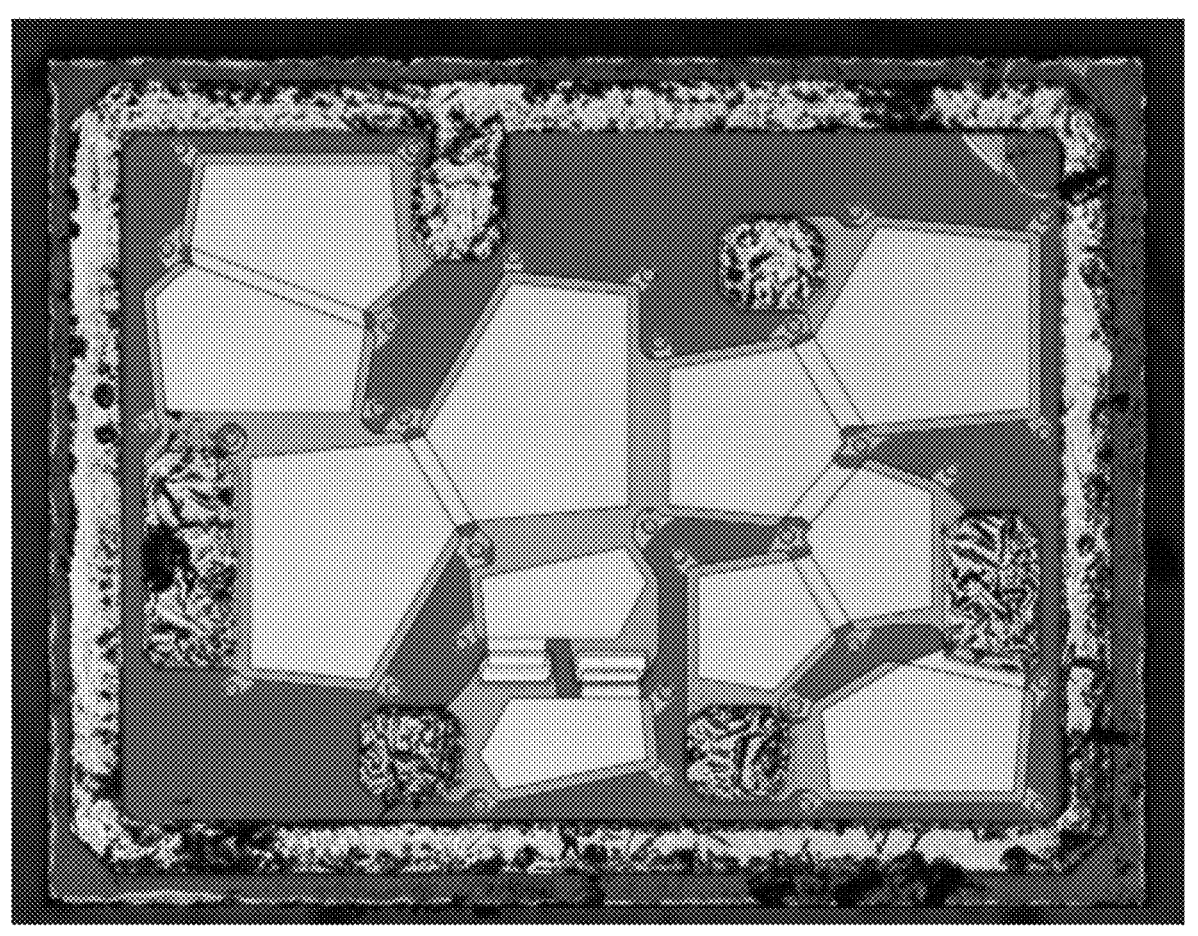
FIG. 2 shows a schematic structural diagram of a filter using a prior art pentagonal resonator.

Referring to FIG. 2, a traditional pentagonal resonator has more edges and corners, and is mostly an irregular asymmetric pentagon, which is difficult to process. Moreover, the asymmetry leads to asymmetric vibration modes, which results in complex vibration characteristics, and further causes vibration to be unstable or unpredictable. In addition, the vibration of the pentagonal resonator is difficult to be described with simple mathematical models, which makes the process of analyzing and understanding vibration behaviors very difficult.

In this embodiment, the Cartesian curve 710 is rounded and free of right angles. Some of curves that satisfy the Cartesian equation form symmetrical closed figures, such as a cardioid, a pancardioid, a folium, an oval, an ellipse, and the like. This symmetry allows for easy processing and more stable vibration, and can be modeled by simple linear differential equations, thus effectively simplifying the analysis of vibration and the understanding of vibration behaviors.

On the one hand, the symmetric figures comprised of a Cartesian curve 710 can increase a transmission distance of the transverse waves, thus reducing the parasitic effect. On the other hand, compared with traditional circular and polygonal resonators, the symmetric figures comprised of the Cartesian curve 710 has higher geometric order, and irregular curves thereof can promote the reflection and interference of the transverse waves, which generates multiple resonant modes (i.e., waves vibrating at different frequencies). However, due to the symmetry of the closed figures, these resonant modes cancel out at a geometric center of the resonator, thus suppressing parasitic modes to a greater extent. Then fewer vibrational nodes (vibrational nodes are points where sound waves are reflected) are generated and less energy is leaked during the propagation of the transverse waves, thus reducing the energy loss of the resonator, and thus improving a Q value of the resonator.

Figure 3:
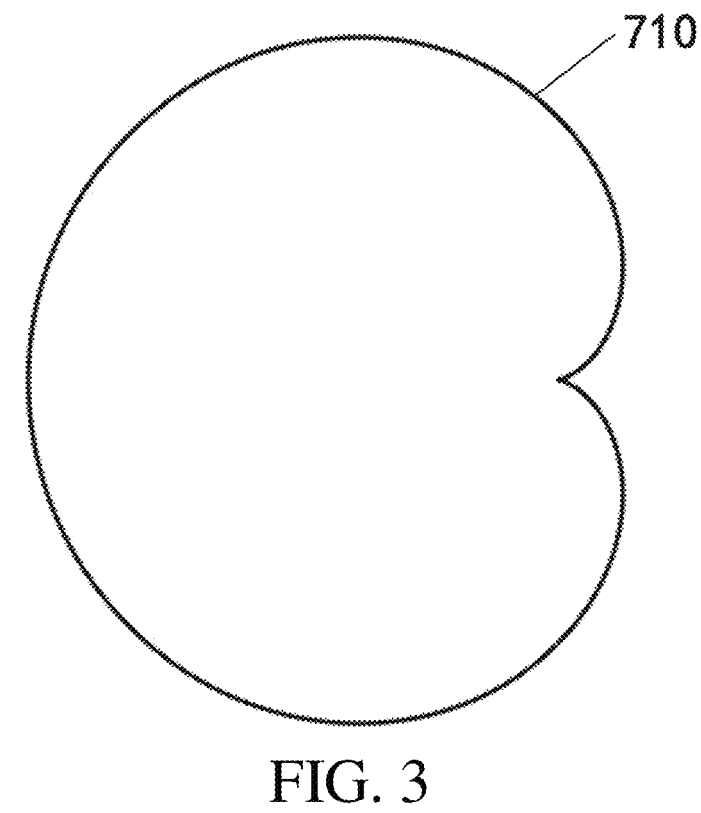
FIG. 3 shows a closed figure comprised of a Cartesian cardioid in an embodiment of the present disclosure.
Figure 4:
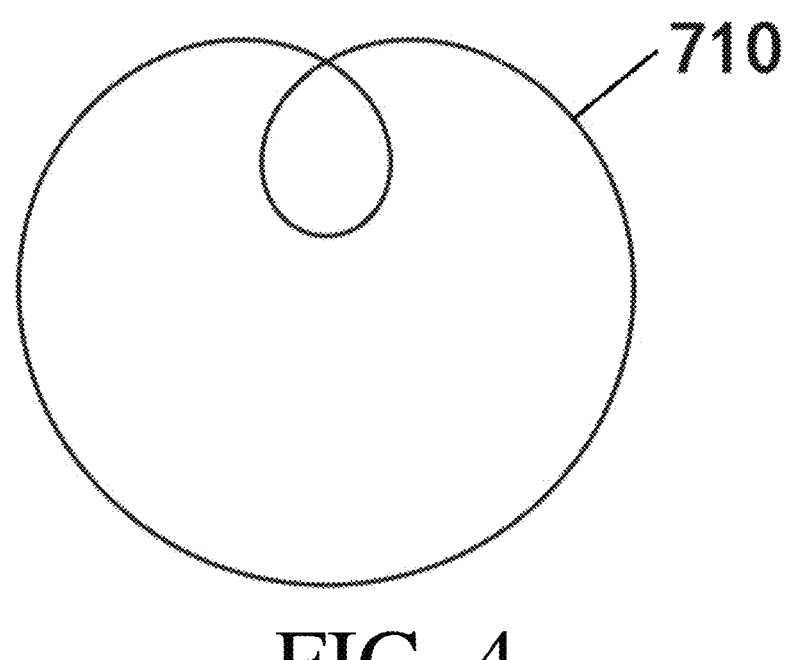
FIG. 4 shows a closed figure comprised of another Cartesian cardioid in an embodiment of the present disclosure.

For example, referring to FIG. 3 and FIG. 4, the contour shapes of the overlapping portions of the bottom electrode 300 and the piezoelectric layer 400 and of the overlapping portions of the piezoelectric layer 400 and the top electrode 500 are each in a shape of a Cartesian cardioid.

When propagating inside the resonator, the transverse waves will be reflected many times. Compared with the traditional pentagonal structure, within the cardioid structure, the transverse waves have a longer propagation path, which causes a greater loss to the transverse waves, thus reducing the adverse effects of the transverse waves on the performance of the resonator.

At the same time, the Cartesian cardioid is smooth, which can effectively reduce the risk of damage to a filter chip during processing, and avoid the stress concentration at an edge of the chip from affecting the quality of the resonator, thus improving the yield and reliability of the filter chip. In addition, the cardioid has a greater utilization of area, which is conducive to miniaturization of the filter chip. Moreover, the cardioid structure can be generated in a single pass by simply applying the Cartesian cardioid formula. Therefore, the design process is simple and convenient. The specific design process includes:

A1. Obtain a resonator area for the desired design;

A2. Calculate a first curve parameter based on the resonator area by using a Cartesian cardioid area formula:

$$S = 3 \cdot (\pi \cdot a_1^2)/2;$$

where S is the resonator area, and $a_1$ is the first curve parameter;

A3. Determine the contour shape of the overlapping portions based on the first curve parameters by using a Cartesian cardioid polar coordinate system formula:

$$\rho = a_1 (1 - \sin(\theta_1)), \ 0 \le \theta_1 \le 2\pi, \ a_1 > 0; \qquad \text{Formula 1}$$

where $\rho$ is a value of polar axis coordinates constituting the cardioid, and $\theta_1$ is a value of angular coordinates constituting the cardioid.

It should be noted that the Cartesian cardioid polar coordinate system formula is not limited to Formula 1, and may be transformed into curves with shapes similar to the cardioid shape as needed, such as $\rho = a_1(1 - \cos(\theta_1))$, $\rho = a_1(1 - \cos(2\theta_1))$, and $\rho = 1 - a_1 \cdot \sin(\theta_1)$. Taking the curve of $\rho = 1 - 2\sin(\theta_1)$ as an example, and referring to FIG. 4, the curves at a cardioid depression have overlapping portions, and in practice, the outermost contour is taken as the shape of the resonator, which is still of the cardioid shape and the curves that make up the cardioid shape are more curved, which can reduce the concentration of the transverse waves on the cardioid depression, further improving the performance of the resonator.

Figure 5:
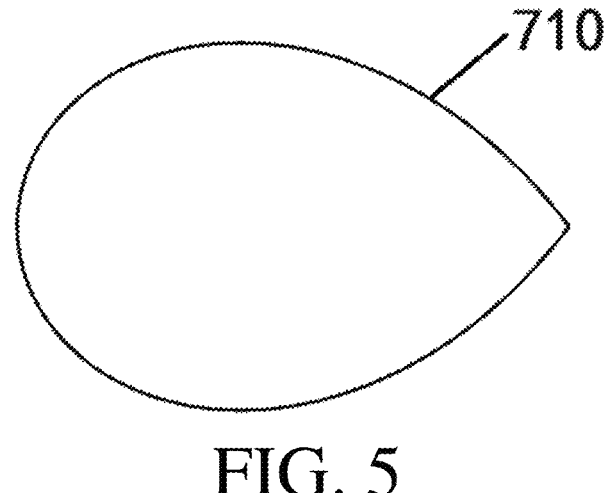
FIG. 5 shows a closed figure comprised of a Cartesian folium in an embodiment of the present disclosure.
Figure 6:
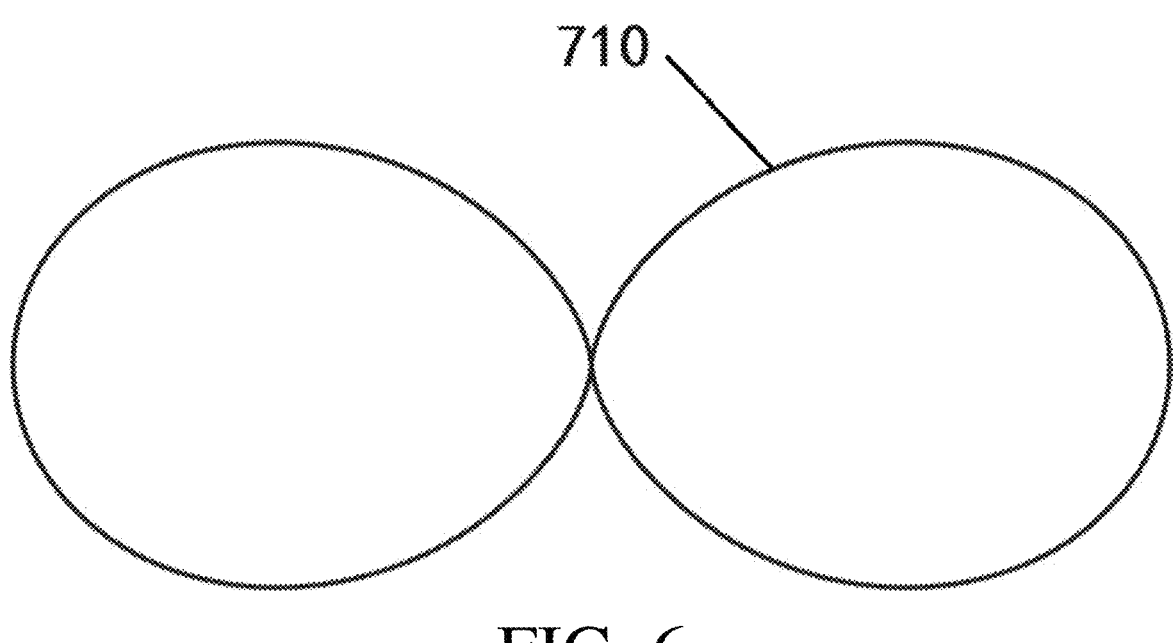
FIG. 6 shows a closed figure comprised of another Cartesian folium in an embodiment of the present disclosure.

For another example, referring to FIG. 5 and FIG. 6, the contour shapes of the overlapping portions of the bottom electrode 300 and the piezoelectric layer 400 and of the overlapping portions of the piezoelectric layer 400 and the top electrode 500 are each in a shape of a Cartesian folium. Similarly, the specific design process includes:

B1. Obtain a resonator area for the desired design;

B2. Calculate a second curve parameter based on the resonator area by using a Cartesian folium area formula (common knowledge, no more detailed description):

B3. Determine the contour shape of the overlapping portions based on the second curve parameters by using a Cartesian folium polar coordinate system formula:

$$r = \frac{3a_2\sin\theta_2\cos\theta_2}{\sin^3\theta_2 + \cos^3\theta_2}, \ \theta_2 \in \left[0, \frac{3\pi}{4}\right) \cup \left(\frac{3\pi}{4}, \pi\right], \ a_2 > 0; \qquad \text{Formula 2}$$

where r is a value of polar axis coordinates constituting the folium, $a_2$ is a second curve parameter, and $\theta_2$ is a value of angular coordinates constituting the folium.

It should be noted that the Cartesian folium polar coordinate system formula is not limited to Formula 2, and may be transformed into curves with shapes similar to the folium shape as needed, such as $r = 1 - \sin(2\theta_2)$. Taking the curve of $r = 1 - \sin(2\theta_2)$ as an example, and referring to FIG. 6, a repeating unit in the curve is taken as the shape of the resonator, the contour of the repeating unit is folium-shaped, the whole curve is smooth, and the structure can increase a transmission distance of the transverse waves, which causes a larger loss to the transverse waves, achieving the weakening and suppression of the transverse waves.

Figure 7:
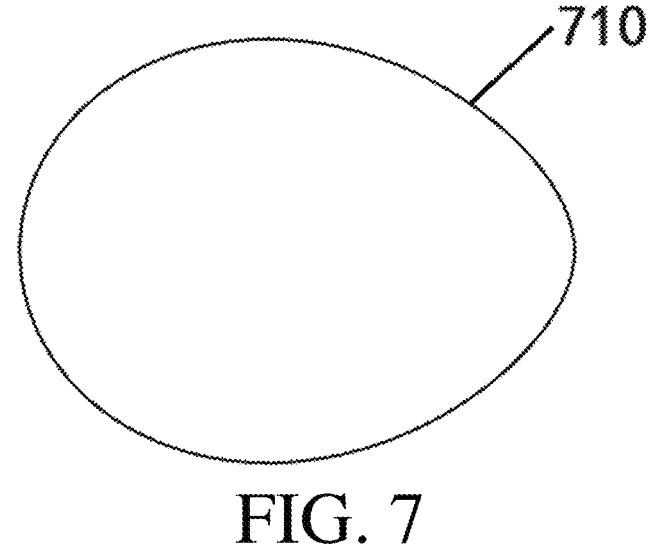
FIG. 7 shows a closed figure comprised of a Cartesian oval in an embodiment of the present disclosure.

For another example, referring to FIG. 7, the contour shapes of the overlapping portions of the bottom electrode 300 and the piezoelectric layer 400 and of the overlapping portions of the piezoelectric layer 400 and the top electrode 500 are each in a shape of a Cartesian oval.

Similarly, the specific design process includes:

C1. Obtain a resonator area for the desired design;

C2. Calculate a third curve parameter based on the resonator area by using a Cartesian oval area formula (common knowledge, no more detailed description):

C3. Determine the contour shape of the overlapping portions based on the third curve parameters by using a Cartesian oval polar coordinate system formula:

$$m\sqrt{(x+a_3)^2+y^2}+n\sqrt{(x-a_3)^2+y^2}=d;$$

where m, n, and d are all predetermined constants, x is a value of x-axis coordinates constituting the oval, y is a value of y-axis coordinates constituting the oval, and $a_3$ is the third curve parameter.

In some embodiments, the contour shapes of the overlapping portions of the bottom electrode 300 and the piezoelectric layer 400 and of the overlapping portions of the piezoelectric layer 400 and the top electrode 500 overlap completely. The contour shapes and contour sizes of the bottom electrode 300, the piezoelectric layer 400, and the top electrode 500 are all the same and thus be easier to process, with relatively low processing costs.

In some embodiments, referring to FIG. 8, the contour shapes of the overlapping portions of the bottom electrode 300 and the piezoelectric layer 400 and of the overlapping portions of the piezoelectric layer 400 and the top electrode 500 are the same and the contour sizes of the overlapping portions of the bottom electrode 300 and the piezoelectric layer 400 and of the overlapping portions of the piezoelectric layer 400 and the top electrode 500 decrease or increase in order.

For example, the contour sizes of the support layer 200, the bottom electrode 300, the piezoelectric layer 400, and the top electrode 500 are sequentially reduced inwards. Moreover, a contour line of the bottom electrode 300 is within a contour line of the support layer 200, a contour line of the piezoelectric layer 400 is within a contour line of the bottom electrode 300, a contour line of the top electrode 500 is within the contour line of the piezoelectric layer 400, but projections of the overlapping portions of the bottom electrode 300 and the piezoelectric layer 400 and of the overlapping portions of the piezoelectric layer 400 and the top electrode 500 facing downward along up and down directions all fall within the contour line of the support layer 200.

Further, a spacing between two adjacent contour lines is generally 1 um or 2 um.

For another example, the contour sizes of the bottom electrode 300, the piezoelectric layer 400, and the top electrode 500 increase outwards in order, but the contour size of the support layer 200 is larger than the contour size of the top electrode 500, and the contour line of the bottom electrode 300 is within the contour line of the piezoelectric layer 400, the contour line of the piezoelectric layer 400 is within the contour line of the top electrode 500, but the projections of the overlapping portions of the bottom electrode 300 and the piezoelectric layer 400, and of the overlapping portions of the piezoelectric layer 400 and the top electrode 500 facing downwards along up and down directions all fall within the contour line of the support layer 200.

In some embodiments, the contour shapes of the support layer 200, the bottom electrode 300, the piezoelectric layer 400, and the top electrode 500 may be the same or different, as long as it is ensured that the contour shapes of the overlapping portions of the bottom electrode 300 and the piezoelectric layer 400 and of the overlapping portions of the piezoelectric layer 400 and the top electrode 500 are both symmetrical closed figures and the closed figure is comprised of at least one Cartesian curve 710.

Figure 10:
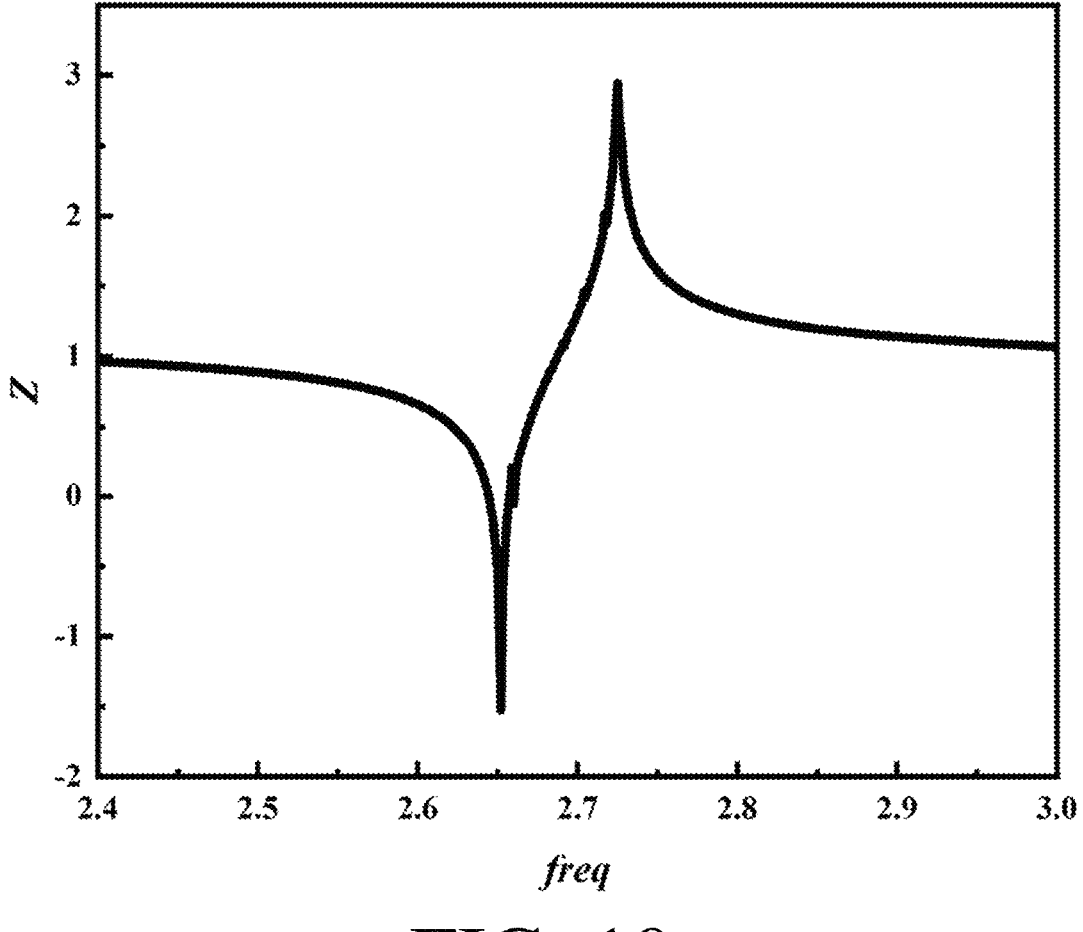
FIG. 10 shows a graph of impedance of the resonator corresponding to FIG. 9.
Figure 11:
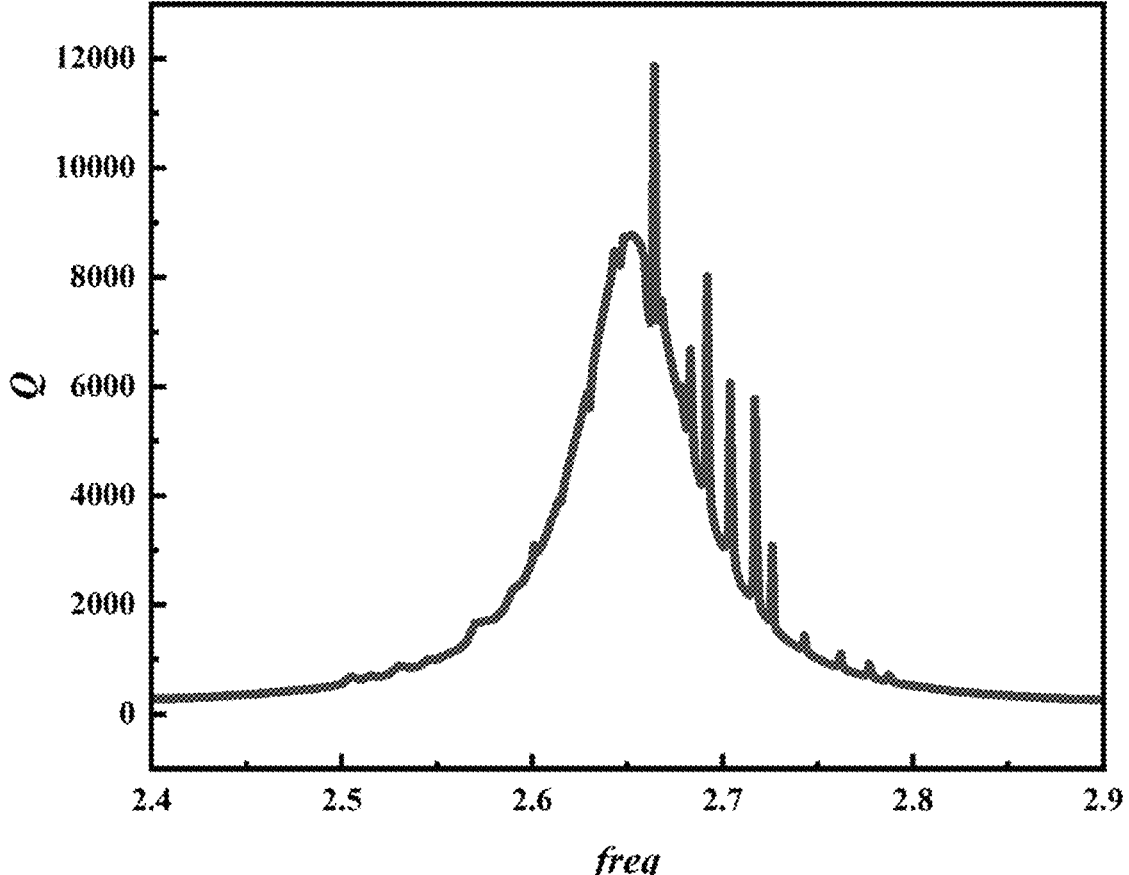
FIG. 11 shows a graph of quality factor of the resonator corresponding to FIG. 9.

Referring to FIG. 9, the overlapping portions of the bottom electrode 300 and the piezoelectric layer 400 and the overlapping portions of the piezoelectric layer 400 and the top electrode 500 are referred to as active regions hereinafter. Taking a resonator in which contour shapes of the active region are all in a shape of a Cartesian cardioid as an example, the support layer 200 is rectangular, the top electrode 500 is connected to a front-end signal 510, the bottom electrode 300 is connected to a back-end signal 310, a thickness of the top electrode 500 is set to 300 nm, a thickness of the piezoelectric layer 400 is set to 600 nm, a thickness of the bottom electrode 300 is set to 300 nm, a thickness of the support layer 200 is set to 20 nm, and an area of the active region is set to $4*10^4$ um². After simulation experiments, FIG. 10 and FIG. 11 are obtained, which show that there is no obvious parasitic effect, and that the resonator has a higher Q value, and the resonator has a better performance.

In some embodiments, a Bragg reflection layer may be provided between the substrate 100 and the support layer 200 for reflecting acoustic waves and limiting the leakage of acoustic wave energy, which can further enhance the performance of the resonator.

Figure 12:
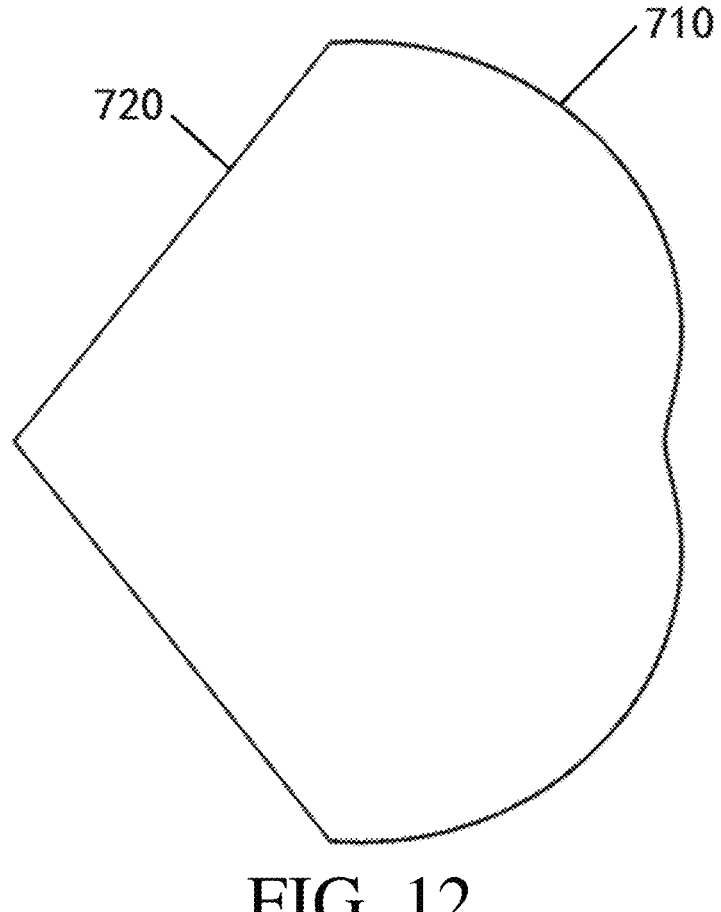
FIG. 12 shows a closed figure including a Cartesian curve and a straight line in an embodiment of the present disclosure.

In some embodiments, referring to FIG. 12, the closed figure further comprises at least one straight line 720.

In this embodiment, it is not limited to the use of one Cartesian curve 710 or a plurality of Cartesian curves 710 to form the closed figure, and the straight line 720 can be introduced without destroying the symmetry of the closed figure, which can also suppress the transverse mode to some extent.

In some embodiments, the substrate 100 is made of any one of Si, SiO₂, SiC, sapphire, LiGaO₂, and metal elements;

the support layer 200 is made of any one of AlN, SiO₂, SiC, and Si₃N₄;

the bottom electrode 300 and the top electrode 500 are made of any one of Al, Mo, W, Pt, Ti, Au, and Ru, respectively; and the piezoelectric layer 400 is made of any one of single crystal AlN, polycrystal AlN, ZnO, PZT, LiNbO₃, LiTaO₃, and BST.

The present disclosure further provides a bulk acoustic wave filter, including the Cartesian curve configuration-based bulk acoustic wave resonator in the foregoing embodiments.

In some embodiment, the bulk acoustic wave filter includes a plurality of the Cartesian curve configuration-based bulk acoustic wave resonators connected in series with each other and/or a plurality of the Cartesian curve configuration-based bulk acoustic wave resonators connected in parallel with each other.

Figure 13:
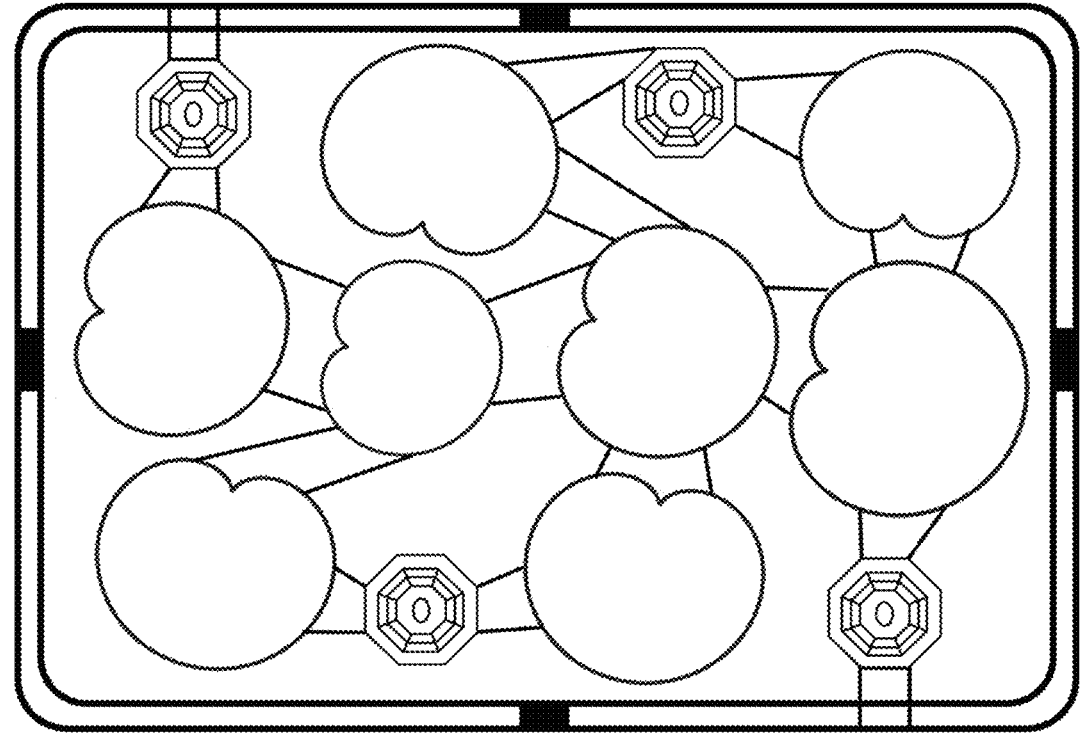
FIG. 13 shows a schematic structural diagram of a bulk acoustic wave filter provided by an embodiment of the present disclosure.

In this embodiment, referring to FIG. 13, the bulk acoustic wave filter includes a filter circuit consisting of four resonators connected in series and four resonators connected in parallel, and the head and tail of the filter circuit formed are connected to a signal input and a signal output, respectively, to achieve a filtering effect.

In some embodiments, an inductor may be introduced into the filter circuit to bring in a new zero to achieve a better suppression and passband effect.

In the description of this specification, the description with reference to the terms "one embodiment", "some embodiments", "exemplary embodiments", "examples", "specific examples", or "some examples", etc. means that the specific features, structures, materials or characteristics described with reference to the embodiments or examples are involved in at least one embodiment or example of the present disclosure. In this specification, exemplary expression of the above terms does not necessarily refer to the same embodiments or examples. Moreover, specific features, structures, materials, or characteristics described may be combined in any one or more of the embodiments or examples in a suitable manner.

The descriptions above are just some embodiments of the present disclosure. For those skilled in the art, several variations and improvements can also be made without departing from the spirit of the present disclosure, and those all fall within the scope of protection of the present disclosure.

What is claimed is:

1. A Cartesian curve configuration-based bulk acoustic wave resonator, comprising a substrate (100), a support layer (200), a bottom electrode (300), a piezoelectric layer (400), and a top electrode (500) stacked sequentially, with a cavity (600) disposed between the substrate (100) and the support layer (200), wherein contour shapes of overlapping portions of the bottom electrode (300) and the piezoelectric layer (400) and of overlapping portions of the piezoelectric layer (400) and the top electrode (500) are both symmetrical closed figures and the closed figure is comprised of at least one Cartesian curve (710);

wherein the contour shapes of the overlapping portions of the bottom electrode (300) and the piezoelectric layer (400) and of the overlapping portions of the piezoelectric layer (400) and the top electrode (500) are each in a shape of a Cartesian cardioid, a shape of a Cartesian folium, or a shape of a Cartesian oval.

2. The Cartesian curve configuration-based bulk acoustic wave resonator according to claim 1, wherein the contour shapes of the overlapping portions of the bottom electrode (300) and the piezoelectric layer (400) and of the overlapping portions of the piezoelectric layer (400) and the top electrode (500) overlap completely.

3. The Cartesian curve configuration-based bulk acoustic wave resonator according to claim 1, wherein the contour shapes of the overlapping portions of the bottom electrode (300) and the piezoelectric layer (400) and of the overlapping portions of the piezoelectric layer (400) and the top electrode (500) are the same and contour sizes of the overlapping portions of the bottom electrode (300) and the piezoelectric layer (400) and of the overlapping portions of the piezoelectric layer (400) and the top electrode (500) decrease or increase in order.

4. The Cartesian curve configuration-based bulk acoustic wave resonator according to claim 1, wherein the substrate (100) is made of any one of Si, $SiO_2$, SiC, sapphire, $LiGaO_2$, and metal elements;

the support layer (200) is made of any one of AlN, $SiO_2$, SiC, and $Si_3N_4$;

the bottom electrode (300) and the top electrode (500) are made of any one of Al, Mo, W, Pt, Ti, Au, and Ru, respectively; and the piezoelectric layer (400) is made of any one of single crystal AlN, polycrystal AlN, ZnO, PZT, $LiNbO_3$, $LiTaO_3$, and BST.

5. A bulk acoustic wave filter, comprising the Cartesian curve configuration-based bulk acoustic wave resonator according to claim 1.

6. The bulk acoustic wave filter according to claim 5, comprising a plurality of the Cartesian curve configuration-based bulk acoustic wave resonators connected in series with each other and/or a plurality of the Cartesian curve configuration-based bulk acoustic wave resonators connected in parallel with each other.

* * * * *